(12) United States Patent
Hsiao et al.

(10) Patent No.: US 10,460,815 B2
(45) Date of Patent: Oct. 29, 2019

(54) DECODING METHOD OF SELECTING OPTIMIZED READ VOLTAGE SET BASED ON GRAY CODE COUNT DEVIATION SUMMATIONS, AND STORAGE CONTROLLER USING THE SAME

(71) Applicant: Shenzhen EpoStar Electronics Limited CO., Shenzhen (CN)

(72) Inventors: Yu-Hua Hsiao, Hsinchu County (TW); Tzu-Wei Fang, Taipei (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/032,079

(22) Filed: Jul. 11, 2018

(65) Prior Publication Data

US 2019/0304546 A1    Oct. 3, 2019

(30) Foreign Application Priority Data

Mar. 30, 2018    (TW) .............................. 107111387 A

(51) Int. Cl.
*G06F 3/06* (2006.01)
*G11C 16/26* (2006.01)
(Continued)

(52) U.S. Cl.
CPC ............ *G11C 16/26* (2013.01); *G06F 3/0604* (2013.01); *G06F 3/0632* (2013.01);
(Continued)

(58) Field of Classification Search
CPC .... G06F 3/0604; G06F 3/0632; G06F 3/0659; G06F 3/0679; G06F 13/1668;
(Continued)

(56) References Cited

U.S. PATENT DOCUMENTS 8,159,881 B2    4/2012   Yang
9,025,393 B2    5/2015   Wu et al.
(Continued)

FOREIGN PATENT DOCUMENTS

CN    102077298    5/2011
CN    102246241    11/2011
(Continued)

OTHER PUBLICATIONS

"Office Action of Taiwan Counterpart Application", dated Oct. 19, 2018, p. 1-p. 3.

*Primary Examiner* — Larry T Mackall
(74) *Attorney, Agent, or Firm* — JCIPRNET

(57) ABSTRACT

A decoding method and a storage controller for a rewritable non-volatile memory module are provided. The method includes choosing a target word line among a plurality of word lines, wherein a plurality of target memory cells of the target word-line are programmed; reading the target memory cells by respectively using different X read voltage sets, so as to obtain X Gray code count deviation summations, wherein the X read voltage sets and the corresponding X Gray code count deviation summations are all ordered based on a first predefined order; and choosing one of the X read voltage sets as an optimized read voltage set according to the X Gray code count deviation summations.

16 Claims, 7 Drawing Sheets

(51) Int. Cl.
  *G06F 13/16* (2006.01)
  *G06F 13/42* (2006.01)
  *G11C 16/10* (2006.01)
  *G11C 11/56* (2006.01)
  *G11C 16/04* (2006.01)

(52) U.S. Cl.
  CPC .......... *G06F 3/0659* (2013.01); *G06F 3/0679* (2013.01); *G06F 13/1668* (2013.01); *G06F 13/4282* (2013.01); *G11C 16/10* (2013.01); *G06F 2213/0012* (2013.01); *G06F 2213/0026* (2013.01); *G06F 2213/0032* (2013.01); *G06F 2213/0042* (2013.01); *G11C 11/5642* (2013.01); *G11C 11/5671* (2013.01); *G11C 16/0483* (2013.01)

(58) Field of Classification Search
  CPC ......... G06F 13/4282; G06F 2213/0012; G06F 2213/0026; G06F 2213/0032; G06F 2213/0042; G11C 11/5642; G11C 11/5671; G11C 16/0483; G11C 16/10; G11C 16/26
  See application file for complete search history.

(56) References Cited

U.S. PATENT DOCUMENTS

| | | | |
|---|---|---|---|
| 2013/0003459 A1 | 1/2013 | Ulriksson et al. | |
| 2013/0121084 A1* | 5/2013 | Jeon | G06F 11/1072 365/185.24 |
| 2015/0085573 A1* | 3/2015 | Sharon | G06F 11/1048 365/185.03 |
| 2015/0117107 A1* | 4/2015 | Sun | G11C 16/10 365/185.12 |

FOREIGN PATENT DOCUMENTS

| | | |
|---|---|---|
| CN | 107527644 | 12/2017 |
| TW | 201535384 | 9/2015 |

\* cited by examiner

- Gray code count sets respectively corresponding to read voltage sets V(1) to V(X): C(1)~C(X)

- Gray code count deviation sets respectively corresponding to read voltage sets V(1) to V(X): D(1)~D(X)

- Formula for gray code count deviation
  $D(i)_k = |C(i)_k - C_{std}|$, $\forall i \in [1, X], \forall k \in [1, N]$

| V(i) | SD(i) | |
|---|---|---|
| V(1) | 3215 | SD(1) |
| V(2) | 2813 | SD(2) |
| V(3) | 2631 | SD(3) |
| V(4) | 2614 | SD(4) |
| V(5) | 2367 | SD(5) |
| V(6) | 1690 | SD(6) |
| V(7) | 1103 | SD(7) |
| V(8) | 1082 | SD(8) |
| V(9) | 1240 | SD(9) |
| V(10) | 1650 | SD(10) |
| V(11) | 2247 | SD(11) |
| V(12) | 2539 | SD(12) |
| V(13) | 2966 | SD(13) |

610

◎ Gray code count deviation summations respectively corresponding to read voltage sets V(1) to V(13): SD(1)~SD(13)

◎ Deviation summation threshold: 1500

FIG. 6A

| V(i) | SD(i) | | 620 |
|---|---|---|---|
| V(1) | 3215 | SD(1) | |
| V(2) | 2813 | SD(2) | |
| V(3) | 2631 | SD(3) | |
| V(4) | 2614 | SD(4) | |
| V(5) | 2367 | SD(5) | |
| V(6) | 1390 | SD(6) | |
| V(7) | 1081 | SD(7) | |
| V(8) | 1082 | SD(8) | |
| V(9) | 1240 | SD(9) | |
| V(10) | 1650 | SD(10) | |
| V(11) | 2247 | SD(11) | |
| V(12) | 2539 | SD(12) | |
| V(13) | 2966 | SD(13) | |

◉ Gray code count deviation summations respectively corresponding to read voltage sets V(1) to V(13): SD(1)~SD(13)

◉ Deviation summation threshold: 1500

FIG. 6B

DECODING METHOD OF SELECTING OPTIMIZED READ VOLTAGE SET BASED ON GRAY CODE COUNT DEVIATION SUMMATIONS, AND STORAGE CONTROLLER USING THE SAME

CROSS-REFERENCE TO RELATED APPLICATION

This application claims the priority benefit of Taiwan application serial no. 107111387, filed on Mar. 30, 2018. The entirety of the above-mentioned patent application is hereby incorporated by reference herein and made a part of this specification.

BACKGROUND OF THE INVENTION

Field of the Invention

The invention relates to a decoding method, and particularly relates to a decoding method and a storage controller for a rewritable non-volatile memory module.

Description of Related Art

In general, when data is read from a rewritable non-volatile memory module, if a page reading failure does not occur, the system may read the data based on a default read voltage set or an optimal read voltage set used previously. When a read failure occurs, the system (storage system) may stop using the default read voltage set or the optimal voltage used previously and correspondingly adjust the read voltage set.

In other words, the value of the optimal read voltage set of the rewritable non-volatile memory module is not fixed. However, the conventional processes for adjusting the read voltage set to obtain the optimal read voltage set are resource-consuming. For example, in the first conventional read voltage optimization process, the sizes of a plurality of different read voltages corresponding to different threshold voltage distributions are constantly adjusted (e.g., a read voltage corresponding to a threshold distribution interface in a read voltage set is adjusted, and rest of the read voltages in the read voltage set are fixed) to read the data where the page reading failure occurs in attempt to obtain an optimal data reading result and set the read voltage set corresponding to the optimal data reading result as an optimized read voltage set corresponding to the physical units storing the data. Taking a TLC flash memory (where one memory cell stores three bit values) as an example, a read voltage set has a total of seven read voltages corresponding to different voltage intervals. According to the conventional process, six of the read voltages are fixed, and one of the read voltages is changed. If each read voltage requires X times of adjustment, and the results are obtained through reading in order to compare all the results and find out the optimal one, it requires $(2^3-1)*X=7*X$ read counts to obtain the optimal read voltage. Besides, verified data are required for such conventional process. In other words, the first conventional process requires a large amount of computing resources (e.g., adjusting the read voltage and verifying corresponding read data) and storage space (e.g., the space for storing the verified data). Thus, decoding becomes less efficient.

Alternatively, in the second conventional process, a plurality of adjustment read voltage sets set in advance in the hardware specification of a memory module are adopted to try to read the data and thereby look for the optimal data reading result. Specifically, the read voltages in each of the adjustment read voltage sets cannot be set by the controller of the storage device, and the number of the adjustment read voltage sets is limited. In other words, based on the second conventional process, it may be possible to find out one of the adjustment read voltage sets by which the data is correctly read (i.e., successfully decoded). However, the adjustment read voltage set that is found may not be the optimal read voltage set that meets the current threshold voltage, such as the one found in the first conventional process. Besides, due to the fewer number of adjustment read voltage sets and the lower accuracy, there may be a circumstance where none of the adjustment read voltage sets reads the data correctly.

In other words, while the second conventional process is able to find out the read voltage set that renders correct data in a more efficient manner than the first conventional process, the chance of failure of the second conventional process is also higher than the chance of the first conventional process. In addition, the number of error bits in the read data may also be higher. Hence, the load for decoding is higher.

Thus, how to quickly and efficiently optimize the read voltage without the verified data to facilitate the reading efficiency and the corresponding decoding efficiency of the rewritable non-volatile memory module is now an issue to work on.

SUMMARY OF THE INVENTION

Exemplary embodiments of the invention provide a decoding method and a storage controller capable of quickly and efficiently obtaining an optimized read voltage set without preparation of verified data. Accordingly, data is read correctly by using a plurality of optimized read voltages of the optimized read voltage set and decoding can be carried out efficiently.

An embodiment of the invention provides a decoding method for a storage device including a rewritable non-volatile memory module. The rewritable non-volatile memory module includes a plurality of word lines, each of the word lines includes a plurality of memory cells, each of the memory cells is programmed to store a bit value corresponding to one of a plurality of different Gray codes, a total number of the Gray codes is N, and N is a first predetermined positive integer greater than 2. The method includes the following. A target word line of the word lines is chosen. In addition, a plurality of target memory cells of the target word line are programmed. The target memory cells are read by respectively using a plurality of different X read voltage sets to obtain X Gray code count deviation summations. X is a second predetermined positive integer, the and X read voltage sets and the corresponding X Gray code count deviation summations are ordered based on a first predetermined order. Each of the X read voltage sets has N−1 read voltages ordered based on a second predetermined order, and an $i^{th}$ Gray code count deviation summation in the X Gray code count deviation summations corresponds to an read voltage set of the X read voltage sets, wherein i is 1 to X based on the first predetermined order. One of the X read voltage sets is chosen as an optimized read voltage set based on the X Gray code count deviation summations.

An embodiment of the invention provides a storage controller. The storage controller controls a storage device including a rewritable non-volatile memory module. The storage controller includes a connection interface circuit, a memory interface control circuit, a read voltage management circuit unit, and a processor. the connection interface circuit is coupled to a host system. The memory interface control circuit is coupled to the rewritable non-volatile memory module. The rewritable non-volatile memory module includes a plurality of word lines. Each of the word lines includes a plurality of memory cells. Each of the memory cells is programmed to store a bit value corresponding to one of a plurality of different Gray codes. A total number of the Gray codes is N, and N is a first predetermined positive integer greater than 2. The processor is coupled to the connection interface circuit, the memory interface control circuit, and the read voltage management circuit unit. The processor chooses a target word line of the word lines and instructs the read voltage management circuit unit to perform a read voltage optimization operation corresponding to the target word line. A plurality of target memory cells of the target word line are programmed. In the read voltage optimization operation, the read voltage management circuit reads the target memory cells by respectively using a plurality of different X read voltage sets to obtain X Gray code count deviation summations, wherein X is a second predetermined positive integer. The X read voltage sets and the corresponding X Gray code count deviation summations are ordered based on a first predetermined order. Each of the X read voltage sets has N−1 read voltages ordered based on a second predetermined order, and an $i^{th}$ Gray code count deviation summation in the X Gray code count deviation summations corresponds to an $i^{th}$ read voltage set of the X read voltage sets, wherein i is 1 to X based on the first predetermined order. Moreover, the read voltage management circuit unit further chooses one of the X read voltage sets as an optimized read voltage set based on the X Gray code count deviation summations.

Based on the above, the decoding method and the storage controller according to the embodiments of the invention are capable of performing the read voltage optimization process corresponding to the target word line to any target word line without preparing verified data (also called as "preset data" or "golden data"). In the read voltage optimization operation, the storage controller may directly use multiple different read voltage sets to obtain multiple different Gray code count deviation summations. Accordingly, one of the X read voltage set may be chosen as the optimized read voltage set based on the multiple X Gray code count deviation summations, so as to form the optimized read voltage set corresponding to the target word line. By using the optimized read voltage set, the accuracy of the read data is facilitated, and the decoding for reading becomes more efficient in general.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6A is a schematic diagram illustrating determining an optimized read voltage set based on Gray code count deviation summations according to an embodiment of the invention.

FIG. 6B is a schematic diagram illustrating detei inning an optimized read voltage set based on Gray code count deviation summations according to another embodiment of the invention.

DESCRIPTION OF EMBODIMENTS

In the present embodiment, a storage device includes a rewritable non-volatile memory module and a storage device controller (which is also referred to as a storage controller or a storage control circuit). Moreover, the storage device is used together with a host system, and the host system may write data into the storage device or read data from the storage device.

Figure 1:
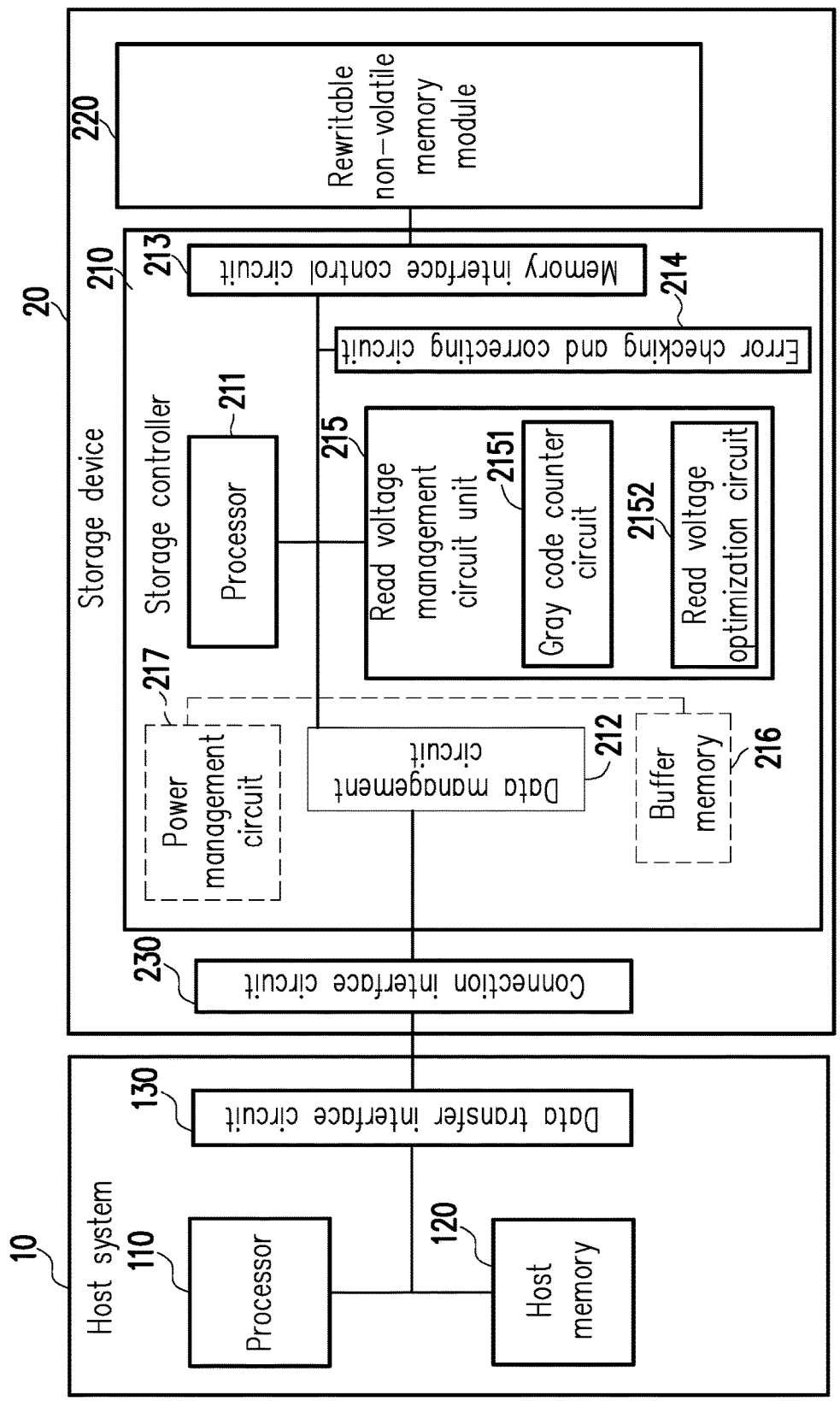
FIG. 1 is a schematic block diagram of a host system and a storage device according to an embodiment of the invention.

FIG. 1 is a schematic block diagram of a host system and a storage device according to an embodiment of the invention.

Referring to FIG. 1, the host system 10 includes a processor 110, a host memory 120 and a data transfer interface circuit 130. In the present embodiment, the data transfer interface circuit 130 is coupled (i.e., electrically connected to) the processor 110 and the host memory 120. In another embodiment, the processor 110, the host memory 120 and the data transfer interface circuit 130 are coupled to each other through a system bus.

The storage device 20 includes a storage controller 210, a rewritable non-volatile memory module 220 and a connection interface circuit 230. The storage controller 210 includes a processor 211, a data management circuit 212 and a memory interface control circuit 213.

In the present embodiment, the host system 10 is coupled to the storage device 20 through the data transfer interface circuit 130 and the connection interface circuit 230 of the storage device 20 to implement a data access operation. For example, the host system 10 may store data to the storage device 20 or read data from the storage device 20 through the data transfer interface circuit 130.

In the present embodiment, the processor 110, the host memory 120 and the data transfer interface circuit 130 may be disposed on a motherboard of the host system 10. The number of the data transfer interface circuit 130 may be one or plural. Through the data transfer interface circuit 130, the motherboard may be coupled to the storage device 20 through a wired or wireless manner. The storage device 20 is, for example, a flash drive, a memory card, a solid state disk (SSD) or a wireless memory storage device. The wireless memory storage device is, for example, a memory storage device based on various wireless communication techniques such as a near field communication (NFC) memory storage device, a WiFi memory storage device, a Bluetooth memory storage device or a low power consumption Bluetooth memory storage device (for example, iBeacon), etc. Moreover, the motherboard may also be coupled to a global positioning system (GPS) module, a network interface card, a wireless transmission device, or various I/O devices such as a keyboard, a screen, a mouse, a loudspeaker, etc. through the system bus.

In the present embodiment, the data transfer interface circuit 130 and the connection interface circuit 230 are interface circuits compatible to a peripheral component interconnect express (PCI express) standard. Moreover, the data transfer interface circuit 130 and the connection interface circuit 230 implement data transmission therebetween by using a non-volatile memory express (NVMe) communication protocol.

However, it should be noted that the invention is not limited thereto, and the data transfer interface circuit 130 and the connection interface circuit 230 may also be compliant with a parallel advanced technology attachment (PATA) standard, an institute of electrical and electronics engineers (IEEE) 1394 standard, a serial advanced technology attachment (SATA) standard, a universal serial bus (USB) standard, a SD interface standard, an ultra high speed-I (UHS-I) interface standard, an ultra high speed-II (UHS-II) interface standard, a memory stick (MS) interface standard, a multi-chip package interface standard, a multi media card (MMC) interface standard, an eMMC interface standard, a universal flash storage (UFS) interface standard, an eMCP interface standard, a CF interface standard, an integrated device electronics (IDE) standard or other suitable standards. Moreover, in another embodiment, the connection interface circuit 230 and the storage controller 210 may be packaged in one chip, or the connection interface circuit 230 is disposed outside a chip containing the storage controller 210.

In the present embodiment, the host memory 120 is used for temporarily storing a command or data executed by the processor 110. For example, in the present exemplary embodiment, the host memory 120 may be a dynamic random access memory (DRAM), a static random access memory (SRAM), etc. However, it should be noted that the invention is not limited thereto, and the host memory 120 may also be other suitable memory.

The storage controller 210 is used for executing a plurality of logical gates or control commands implemented in a hardware form or firmware form, and performing data writing, reading, and erasing operations on the rewritable non-volatile memory module 220 according to commands of the host system 10.

To be specific, the processor 211 of the storage controller 210 is hardware having computation capability, and is used for controlling a whole operation of the storage controller 210. Specifically, the processor 211 has a plurality of control commands, and when the storage device 200 operates, the control commands are executed for the data writing, reading and erasing operations.

It should be noted that in the present embodiment, the processor 110 and the processor 211 are, for example, central processing units (CPU), micro-processors or other programmable microprocessors, digital signal processors (DSP), programmable controllers, application specific integrated circuits (ASIC), programmable logic devices (PLD) or other similar circuit devices, which are not limited by the invention.

In an embodiment, the storage controller 210 further has a read-only memory (not shown) and a random access memory (not shown). Particularly, the read-only memory has a boot code, and when the storage controller 210 is enabled, the processor 211 firstly executes the boot code to load the control commands stored in the rewritable non-volatile memory module 220 to the random access memory of the storage controller 210. Afterwards, the processor 211 may execute the control commands to perform the data writing, reading and erasing operations. In another embodiment, the control commands of the processor 211 may also be stored in a specific area of the rewritable non-volatile memory module 220 (for example, a physical storage unit in the rewritable non-volatile memory module 220 used for storing system data) in form of program code.

In the present embodiment, as described above, the storage controller 210 further includes the data management circuit 212 and the memory interface control circuit 213. It should be noted that the operations executed by the components of the storage controller 210 may also be regarded as operations executed by the storage controller 210.

The data management circuit 212 is coupled to the processor 211, the memory interface control circuit 213 and the connection interface circuit 230. The data management circuit 212 is used for receiving instructions of the processor 211 to implement data transfer. For example, data is read from the host system 10 (for example, the host memory 120) through the connection interface circuit 230, and the read data is written into the rewritable non-volatile memory module 220 through the memory interface control circuit 213 (for example, the writing operation is performed according to a writing command coming from the host system 10). For another example, data may be read from one or more physical units of the rewritable non-volatile memory module 220 (the data may be read from one or more memory cells of the one or more physical units) through the memory interface control circuit 213, and the read data is written to the host system 10 (for example, the host memory 120) through the connection interface circuit 230 (for example, the reading operation is performed according to a reading command coming from the host system 10). In another embodiment, the data management circuit 212 may also be integrated into the processor 211.

The memory interface control circuit 213 receives an instruction of the processor 211, and performs the writing (also referred to as programming) operation, reading operation or erasing operation to the rewritable non-volatile memory module 220 in collaboration with the data management circuit 212.

For example, the processor 211 may execute a writing command sequence to instruct the memory interface control circuit 213 to write data to the rewritable non-volatile memory module 220. The processor 211 may execute a reading command sequence to instruct the memory interface control circuit 213 to read data from one or more physical units (also referred to as target physical units), corresponding to the reading command, of the rewritable non-volatile memory module 220. The processor 211 may execute an erasing command sequence to instruct the memory interface control circuit 213 to perform an erasing operation to the rewritable non-volatile memory module 220. The writing command sequence, the reading command sequence and the erasing command sequence may respectively include one or more program codes or command codes and instruct to perform the corresponding writing, reading and erasing operation to the rewritable non-volatile memory module 220. In an embodiment, the processor 211 may also send other types of the command sequence to the memory interface control circuit 213 to execute the corresponding operation to the rewritable non-volatile memory module 220.

Moreover, the data to be written into the rewritable non-volatile memory module 220 is converted into a format that is acceptable to the rewritable non-volatile memory module 220 by the memory interface control circuit 213. To be specific, if the processor 211 is about to access the rewritable non-volatile memory module 220, the processor 211 may send the corresponding command sequences to the memory interface control circuit 213 to instruct the memory interface control circuit 213 to execute the corresponding operations. For example, the command sequences include the writing command sequence instructing to write data, the reading command sequence instructing to read data, the erasing command sequence instructing to erase data, and corresponding command sequences instructing various memory operations (for example, to change a plurality of default read voltage values of a read voltage set or execute a garbage collection procedure, etc.). These command sequences may include one or more signals, or data on a bus. These signals or data may include command codes or program codes. For example, the reading command sequence may include information of reading identification codes, memory addresses, etc.

The rewritable non-volatile memory module 220 is coupled to the storage controller 210 (the memory interface control circuit 213) and stores data written by the host system 10. The rewritable non-volatile memory module 220 may be a single level cell (SLC) NAND flash memory module (i.e., a flash memory module where one memory cell may store 1 bit), a multi level cell (MLC) NAND flash memory module (i.e., a flash memory module where one memory cell may store 2 bits), a triple level cell (TLC) NAND flash memory module (i.e., a flash memory module where one memory cell may store 3 bits), a quadruple level cell (QLC) NAND flash memory module (i.e., a flash memory module where one memory cell stores four bits), a 3D NAND flash memory module or a vertical NAND flash memory module, etc., or other memory modules having the same characteristics. The memory cells in the rewritable non-volatile memory module 220 are arranged in an array.

In the present embodiment, the rewritable non-volatile memory module 220 has a plurality of word lines, and each of the word lines includes a plurality of memory cells. The memory cells on the same word line may form one or more physical programming units (physical pages). In addition, the physical programming units may form a physical unit (a physical block or a physical erasing unit). The present embodiment takes the TLC NAND flash memory module as an example. In other words, in the following embodiment, a memory cell that may store three bit values may serve as a physical programming unit (i.e., in each programming operation, a programming voltage is applied to one physical programming unit after another to program data). In addition, each of the respective memory cells may be divided into a lower physical page, a middle physical page, and an upper physical page, each storing one bit value.

In the embodiment, the memory cell is the smallest unit for data writing (programming). The physical unit is the smallest unit for erasing. In other words, each physical unit contains the minimum number of memory cells to be erased together. Each physical unit has a plurality of memory cells. In the following embodiment, an example where one physical block serves as one physical unit is described. However, in another embodiment, one physical unit may also be formed by an arbitrary number of memory cells, depending on the practical needs. Besides, it should be understood that when the processor 211 groups the memory cells (or physical units) in the rewritable non-volatile memory module 220 to perform a corresponding management operation, the memory cells (or physical units) are logically grouped, while the physical positions of the memory cells remain the same.

It should be noted that, in the embodiment, system data recording information of a physical unit may be recorded in one or more memory cells in the physical unit or be recorded in one or more memory cells of a specific physical unit recording all system data in a system area. In the present embodiment, the system data corresponding the physical unit includes information such as a program erase cycle (PEC), a data retention timestamp (DRP), a read counter value, etc., of the physical unit. More specifically, every time when the processor 211 performs the erasing operation to a physical unit, the processor 211 may add "1" to the PEC value of the corresponding physical unit when the erasing operation is completed. For example, the PEC value may accumulate from "0" through execution of each erasing operation. In other words, the program erase cycle value reflects the sum of times that the corresponding physical unit is erased. The data retention timestamp is used for instructing the time for which data is stored in the corresponding physical unit. Sizes of the timestamps (e.g., value differences) may reflect a temporal sequence. The invention does not intend to limit a detailed format of the timestamp. Every time when the writing operation is performed to the physical unit, the processor 211 may update the data retention timestamp of the physical unit to be the time at which the physical unit performs the writing operation. In other words, the data retention timestamp corresponding to a physical unit is used for indicating the time at which the latest writing operation is performed to the physical unit (e.g., local time when the latest writing operation is completed). The writing operation includes, for example, programming data to one or more memory cells of the physical unit, or, for example, programming data to another type of physical address of the physical unit. Then, the processor 211 may calculate how long the data in the physical unit has been stored since the previous writing operation based on the data retention timestamp. The read counter value serves to calculate the number of times that the corresponding physical unit is read, and the read counter value is reset when the corresponding physical unit is erased.

For example, in the embodiment, the processor 211 may group a plurality of physical units into a plurality of physical unit groups based on statistical values of the physical units of the rewritable non-volatile memory module 220. The statistical value includes one of the program erase cycle, the data retention timestamp (also referred to as retention value) and the read counter value or a combination thereof. Physical units grouped into the same physical unit group may share similar physical properties. The processor 211 may read data from the physical units grouped into the same physical unit group based on the same read voltage set. For example, the same read voltage set is adopted to issue the read command sequence to perform the read operation to the physical units of the same physical unit group.

In other embodiments, the processor 211 may group the word lines of the rewritable non-volatile memory module 220 into a plurality of word line groups based on statistical values of the word lines (the processor 211 may calculate/sort the statistical values of the respective word lines), and the word lines grouped into the same word line group may have similar physical properties and thus can be read with the same read voltage set (i.e., the corresponding optimized read voltages) as in the previous embodiment. It should be noted that, in order to perform the read voltage optimization operation corresponding to each of the word lines (instead of each of the physical units) to each of the word lines, the following embodiment describes the read voltage optimization operation for each of the word lines and a read voltage optimization method for the operation. For an embodiment having multiple physical unit groups, the processor 211 may choose a word line of a physical unit from each of the physical unit groups to perform the read voltage optimization operation, or choose a physical unit from each of the physical unit groups to perform the read voltage optimization operation.

The storage controller 210 may assign a plurality of logical units to the rewritable non-volatile memory module 220. The host system 10 may access user data stored in the physical units through the assigned logical units. Here, each logical unit may be formed by one or more logical addresses. For example, the logical unit may be a logical block, a logical page, or a logical sector. Each logical unit may be mapped to one or more physical units. In addition, the logical unit may be one or more physical addresses, one or more physical sectors, one or more physical programming units, or one or more physical erasing units. In the embodiment, the logical unit is a logical block, and a logical sub-unit is a logical page. Each logical unit has a plurality of logical sub-units.

Besides, the storage controller 210 may build a logical to physical address mapping table and a physical to logical address mapping table to record the mapping relations between the logical units (e.g., logical blocks, logical pages, or logical sectors) assigned to the rewritable non-volatile memory module 220 and the physical units (e.g., physical erasing units, physical programming units, or physical sectors). In other words, the storage controller 210 may look for a physical unit mapped to a logical unit based on the logical to physical address mapping table, and the storage controller 210 may look up a logical unit mapped to a physical unit based on the physical to logical address mapping table. However, the technical concepts concerning mapping between the logical units and physical units are common technical means familiar to people having ordinary skills in the art. Thus, details in this regard will not be further described in the following.

In the embodiment, an error checking and correcting circuit 214 is coupled to the processor 211 and used for performing an error checking and correction operation to ensure the accuracy of data. Specifically, when the processor 211 receives a writing command from the host system 10, the error checking and correcting circuit 214 may generate a corresponding error correcting code (ECC) and/or error detecting code (EDC). In addition, the processor 211 may write the data and the corresponding ECC and/or EDC to the rewritable non-volatile memory module 220. Afterwards, when reading data from the rewritable non-volatile memory module 220, the processor 211 may also read the ECC or EDC corresponding to the data, and the error checking and correcting circuit 214 may perform the error checking and correcting operation to the read data based on the ECC and/or EDC. Moreover, after the error checking and correcting operation, if the read data is successfully decoded, the error checking and correcting circuit 214 may return an error bit value to the processor 211.

In an embodiment, the storage controller 210 may further include a buffer memory 216 and a power management circuit 217. The buffer memory is coupled to the processor 211 and used for temporarily storing data and commands from the host system 10, data from the rewritable non-volatile memory module 220, or other system data used for managing the storage device 20. Accordingly, the processor 211 may quickly access the data, the command, or the system data from the buffer memory 216. The power management circuit 217 is coupled to the processor 211 and used for controlling power of the storage device 20.

In the embodiment, a read voltage management circuit unit 215 includes a Gray code counter circuit 2151 and a read voltage optimization circuit 2152. The read voltage management circuit unit 215 is used for managing read voltages of the word lines. More specifically, the processor 211 may choose a word line (also referred to as a target word line) of the word lines of the physical units of the rewritable non-volatile memory module 220 at a specific time point, and instruct the read voltage management circuit unit 215 to perform the read voltage optimization operation to the target word line. For example, the processor 211 may choose the target word line from the word lines to perform the read voltage optimization operation when: (1) the storage device 20 is idling (i.e., the storage device 20 is idling for over a predetermined threshold of time); (2) the storage device is turned on; or (3) when the number of error bits in data read from a word line exceeds an error bit threshold. Specifically, the processor 211 may choose a word line from a word line group whose physical state is less preferable (e.g., a word line group having more program erase cycles, a greater read counter value, a longer retention time, or a greater number of error bits) as the target word line based on one of the statistical values and error bit numbers of all the word line groups or a combination thereof. Besides, the processor 211 may also choose the target word line based on the number of error bits returned by the error checking and correcting circuit 214. Specifically, when the number of error bits of data read from a word line exceeds an error bit threshold, the word line may set as the target word line. It should be noted that the chosen target word line already stores data. In other words, data is already programmed in the target word line. Besides, if the read voltage optimization operation for a target word line is completed, the read voltage management circuit unit 215 may record a (optimized) read voltage set corresponding to the target word line.

In an embodiment, the processor 211 may also randomly choose the target word line to perform the read voltage optimization operation. In another embodiment, the processor 211 may also perform the read voltage optimization operation to each of the word lines.

In the following, details concerning how the voltage management circuit unit 215 performs the read voltage optimization operation and the functions of the Gray code counter circuit 2151 and the read voltage optimization circuit 2152 are described with reference to the accompany drawings.

Figure 2:
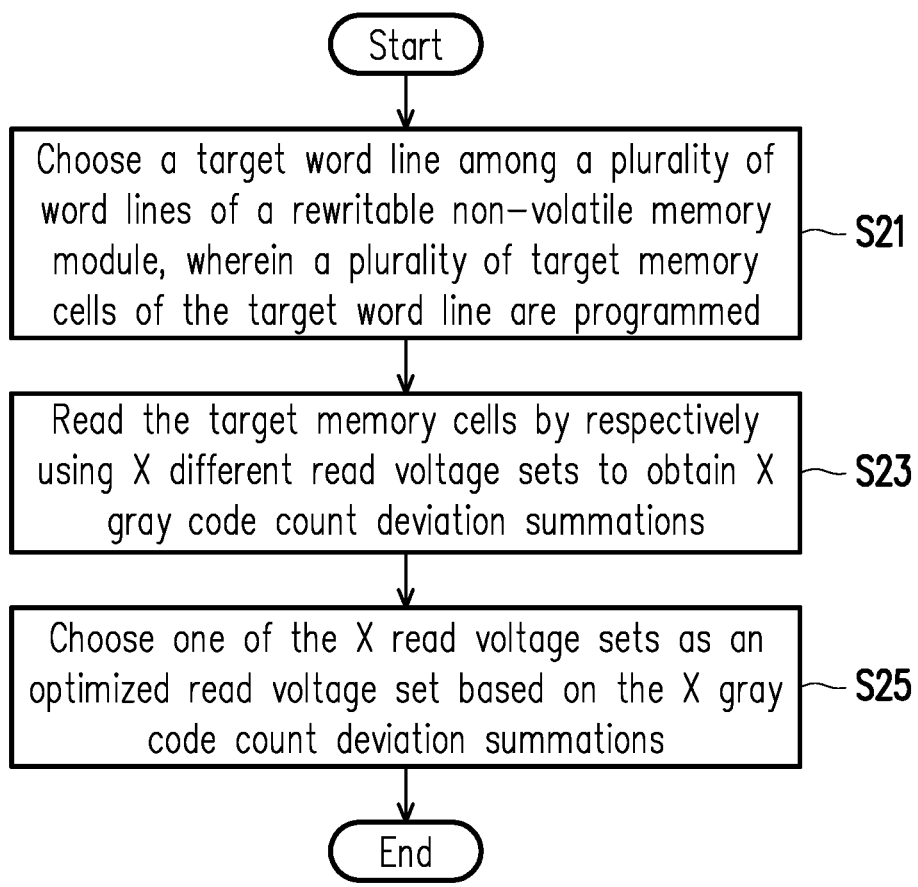
FIG. 2 is a flowchart illustrating a decoding method according to an embodiment of the invention.

FIG. 2 is a flowchart illustrating a decoding method according to an embodiment of the invention. Referring to FIGS. 1 and 2 at the same time, at Step S21, the processor 211 chooses a target word line among a plurality of word lines of the rewritable non-volatile memory module, wherein a plurality of target memory cells of the target word line are programmed.

Assuming that the processor 211 currently performs the read voltage optimization operation to one (also referred to as a target word line group) of the word line groups, the processor 211 may firstly choose the target word line to which the read voltage optimization operation is performed. The target word line may be chosen from the word lines of the target word line group based on a predetermined selection condition. The predetermined selection condition includes: (1) the target word line having a statistical value close to an average of the statistical values of all the word lines of the word line group to which the target word line belongs; (2) the target word line having the number of error bits that is the minimum among all the word lines of the word line group to which the target word line belongs; or (3) a word line being randomly chosen as the target word line.

In the embodiment, data is stored in the target word line. Specifically, each memory cell of each word line is programmed to store a bit value corresponding to one of a plurality of different Gray codes. The total number of the Gray codes is N, and N is a first predetermined positive integer greater than 2. In other words, the memory cells of the target word line may store bit values respectively corresponding to different Gray codes. In the following, details of the Gray codes are described with reference to FIG. 3.

Figure 3:
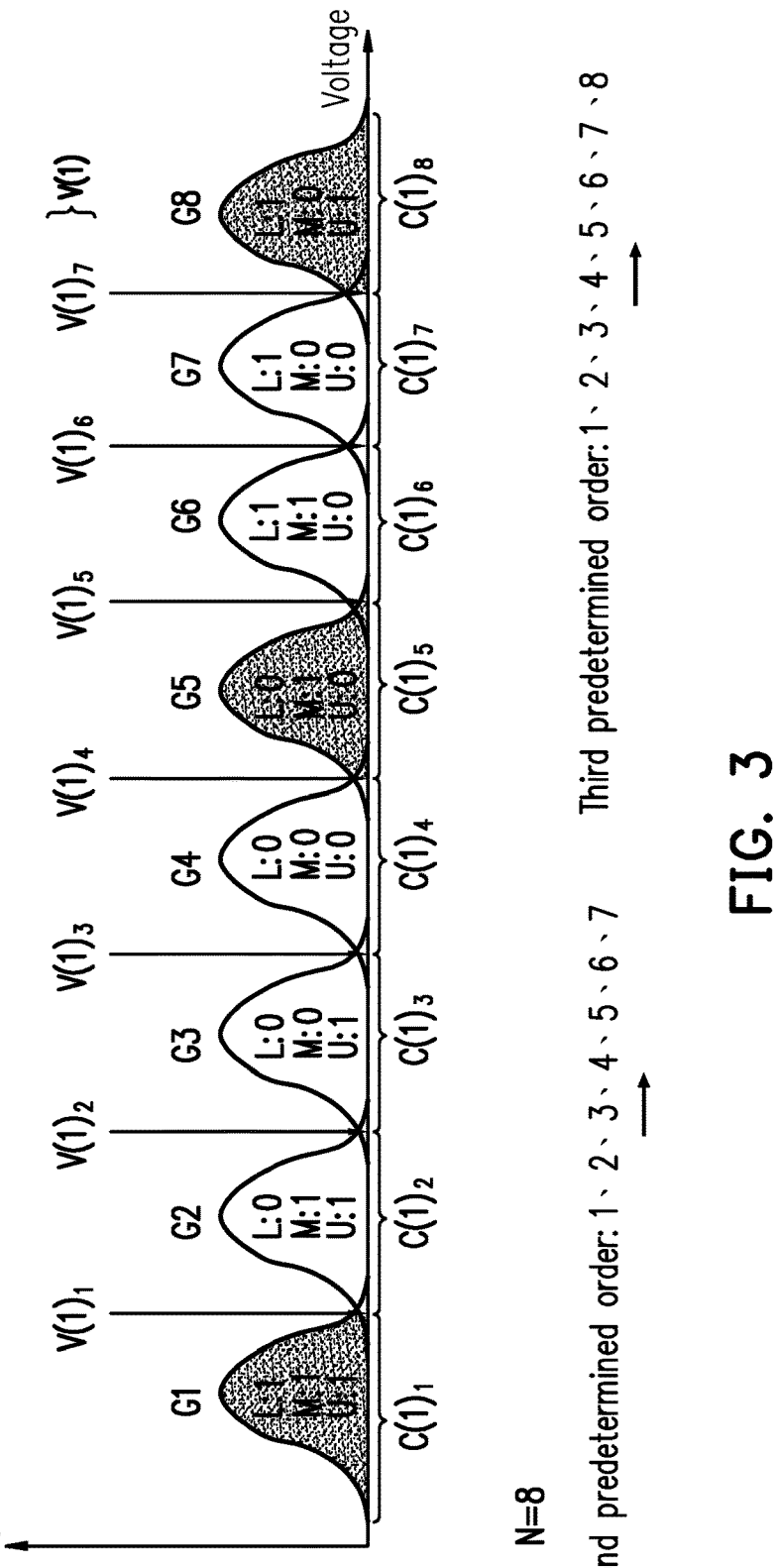
FIG. 3 is a schematic diagram illustrating threshold voltage distributions of a plurality memory cells read by the first read voltage set and corresponding to bit values of N Gray codes and a plurality of corresponding Gray code counts according to an embodiment of the invention.

FIG. 3 is a schematic diagram illustrating threshold voltage distributions of a plurality memory cells read by the first read voltage set and corresponding to bit values of N Gray codes and a plurality of corresponding Gray code counts according to an embodiment of the invention. The embodiment is described with an example of the TLC NAND flash memory module, N is 8 (i.e., $2^3$). Each memory cell of the TLC NAND flash memory module has three physical pages to respectively store bit data. Each memory cell includes a lower physical page (L), a middle physical page (M), and an upper physical page (U), each storing one bit value. Also, it is assumed that the processor 211 reads the memory cells (target memory cells) of the target word line of the TLC NAND flash memory module based on a plurality of read voltages $V(1)_1$ to $V(1)_7$ of the first read voltage set $V(1)$ and thereby identifies different bit values (bit values corresponding to different Gray codes) stored in the memory cells, and gate voltages in the respective memory cells may be classified into eight Gray codes, i.e., "L:1 M:1 U:1", "L:0 M:1 U:1", "L:0 M:0 U:1", "L:0 1\4:0 U:0", "L:0 M:1 U:0", "L:1 M:1 U:0", "L:1 M:0 U:0", and "L:1 M:0 U:1" (L: the bit value of the lower physical page, M: the bit value of the middle physical page, U: the bit value of the upper physical page) based on the read voltages $V(1)_1$ to $V(1)_7$ in the first read voltage set.//The eight Gray codes may also be represented as eight bit value combinations, i.e., "111", "011", "001", "000", "010", "110", "100", and "101". The bit values in each of the bit value combinations are represented in the order of upper, middle, and lower physical pages. In other words, by respectively applying the read voltages $V(1)_1$ to $V(1)_7$ having different voltage values in the first read voltage set $VR(1)$ to one of the memory cells of the target word line, the processor 211 may determine whether the channel of the memory cell is turned on and thereby respectively determine that the bit values (also referred to as bit data or read bit values) stored in the memory cell correspond to one of the different Gray codes (i.e., "111", "011", "001", "000", "010", "110", "100", and "101"). In other words, the bit values are read from one of the memory cells of the target word line based on the first read voltage set $VR(1)$. For example, the read voltage $V(1)_1$ may distinguish between the Gray code "111" and the Gray code "011" (the left of the read voltage $V(1)_1$ is a threshold voltage distribution corresponding to the Gray code "111", and the right of the read voltage $V(1)_1$ is a threshold voltage distribution corresponding to the Gray code "011"). It should be noted that, as the memory cells in the rewritable non-volatile memory module 220 may have a plural number of Gray codes (8 in the example described herein), the number of the read voltages in each read voltage set is the plural number of Gray codes minus 1 (7 in the example described herein, i.e., N−1=8−1=7).

It should be noted that, based on the type of the rewritable non-volatile memory module 220, N may be a predetermined positive integer greater than 2 (also referred to as the first predetermined positive integer). For example, if the rewritable non-volatile memory module 220 is an MLC NAND flash memory module, then N=4; if the rewritable non-volatile memory module 220 is an SLC NAND flash memory module, then N=2; and if the rewritable non-volatile memory module 220 is a QLC NAND flash memory module, then N=16.

It should be noted that, in the embodiment, the threshold voltage distributions of the memory cells of the word line may be deviated from default threshold voltage distributions. Due to the deviation of the threshold voltage distributions, a default read voltage set corresponding to the default threshold voltages is no longer suitable for reading the word line whose threshold voltage distributions are deviated. The processor 211 needs to additionally find an optimized read voltage set for the threshold voltage distributions of the target word line that are already deviated, where each of a plurality of optimized read voltages of the optimized voltage set are close the interface between two corresponding adjacent threshold voltage distributions.

Referring to FIG. 2, at Step S23, the read voltage management circuit unit 215 respectively uses X different read voltage sets to read the target memory cells, so as to obtain X Gray code summation count deviation summations. In addition, each of the X read voltage sets has N−1 read voltages arranged based on the second predetermined order (e.g., based on the voltage size, left to right, $1^{st}$ to N−$1^{th}$, wherein N is 8, for example). X is the second predetermined positive integer, and the X read voltage sets and the corresponding X Gray code count summations are ordered in the first predetermined order. The $i^{th}$ Gray code count deviation summation in the X Gray code count deviation summations corresponds to the read voltage set in the X read voltage sets, wherein i is 1 to X based on the first predetermined order.

In an embodiment, a voltage difference between every pair of adjacent read voltage sets in the X read voltage sets is the first predetermined voltage difference. Specifically, a voltage difference between the $j^{th}$ read voltage of the $i^{th}$ read voltage set and the $j^{th}$ read voltage of the i+$1^{th}$ read voltage set in the X read voltage set is fixed as the first predetermined voltage difference, wherein j is 1 to N−1 based on the second predetermined order. The value of the second predetermined positive integer (e.g., 20 or other positive integers) and the value of the first predetermined voltage difference (e.g., 7.5 mV) may be set in advance in the factory setting.

It should be noted that, in the embodiment, the target memory cells of the target word line are all the memory cells of the target word line used for storing arbitrary data. However, the invention is not limited thereto. For example, in another embodiment, the target memory cells are some memory cells of all the memory cells of the target word line for storing arbitrary data.

Figure 4:
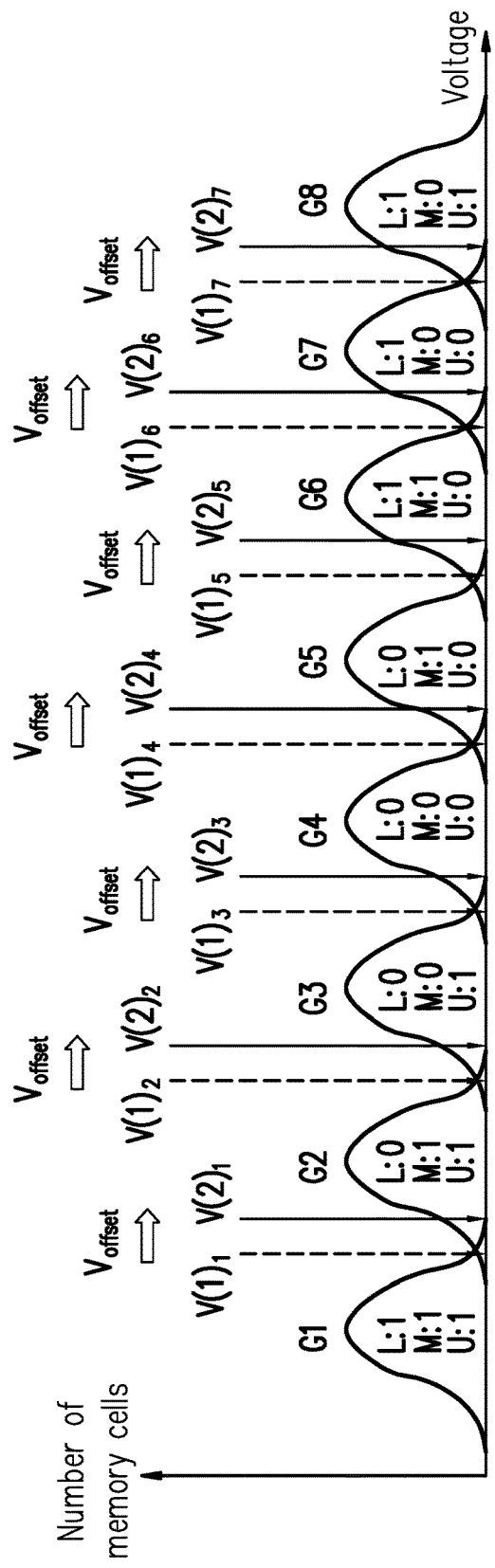
FIG. 4 is a schematic diagram illustrating two different read voltage sets and voltage differences therebetween according to an embodiment of the invention.

FIG. 4 is a schematic diagram illustrating two different read voltage sets and voltage differences therebetween according to an embodiment of the invention.

For example, referring to FIG. 4, assuming that the first read voltage set $V(1)$ is the first read voltage set (e.g., the default read voltage set) of the X read voltage sets, and the second read voltage set $V(2)$ is the second read voltage set of the X read voltage sets, a voltage difference between the pair of adjacent read voltage sets is the first predetermined voltage difference ($V_{offset}$). For example, a voltage difference between the first read voltage $V(2)_1$ of the second read voltage set and the corresponding first read voltage $V(1)_1$ of the first read voltage set is the predetermined voltage difference ($V_{offset}$). In other words, a difference obtained by subtracting the voltage value of the read voltage $V(1)_1$ from the voltage value of the read voltage $V(2)_1$ is $V_{offset}$.

It should be noted that, in the X read voltage sets, a plurality of read voltage sets may be formed by using the first read voltage set as the basis and gradually increasing or decreasing the predetermined voltage difference. For the ease of description, the following embodiment is described with an example where the X read voltage sets are formed by using the first read voltage set as the basis and gradually increasing the predetermined voltage difference. Nevertheless, such example shall not be construed as a limitation on the X read voltage sets of the invention.

It should be noted that, in response to choosing the target word line, the read voltage management circuit unit 215 may identify a plurality of statistical values of the target word line, and adjust the size of the predetermined voltage difference and the value of the second predetermined positive integer based on at least one of the statistical values. The statistical values include the value of program erase cycles of the target word line, the read counter value of the target word line, the retention time value of the target word line, and the number of error bits of the data stored in the target word line. Specifically, if one of the statistical values indicates that the physical condition of the target word line is less desirable (e.g., having a higher number of error bits or a higher value of program erase cycles), the read voltage management circuit unit 215 may adopt a smaller predetermined voltage difference and a greater second predetermined positive integer to look for the optimized read voltage set in a more fine-grained manner by using a greater number of read voltage sets whose intervals therebetween are smaller. Comparatively, if one of the statistical values indicates that the physical condition of the target word line is more desirable (e.g., having a lower number of error bits or a lower value of program erase cycles), the read voltage management circuit unit 215 may adopt a greater predetermined voltage difference and a smaller second predetermined positive integer to look for the optimized read voltage set in a more coarse-grained manner by using a smaller number of read voltage sets whose intervals therebetween are greater.

It should be noted that the invention shall not be limited to the method of setting the X read voltage sets. For example, in another embodiment, each of the X read voltage sets may be set in advance in the factory setting based on the needs and/or the hardware specification of the rewritable non-volatile memory module 220. In the another embodiment, the amplitudes of the read voltages of the respective read voltage sets may be arranged differently, and the voltage difference between every pair of the adjacent read voltage sets is not fixed. More specifically, the voltage difference between the $j^{th}$ read voltage of the $i^{th}$ read voltage set and the $j^{th}$ read voltage of the $i+1^{th}$ read voltage set in the X read voltage set is not fixed, wherein j is 1 to N−1 based on the second predetermined order. For example, in the another embodiment, it is assumed that the voltage difference between the first read voltage of the first read voltage set and the first read voltage of the second read voltage set is 7.5 mV. However, under some circumstance, the voltage difference between the second read voltage of the first read voltage set and the second read voltage of the second read voltage set may be 6 mV, −7 mV, or a voltage difference different from 7.5 mV.

Regarding other details of Step S23, in the operation of reading the target memory cells by respectively using the different X read voltage sets to obtain the X Gray code count deviation summations, the read voltage management circuit unit 215 (e.g., the Gray code counter circuit 2151) may choose the $i^{th}$ read voltage set in the X read voltage sets, wherein the values of i may include 1 to X based on the first predetermined order. For example, referring to FIG. 3, i is assumed to be 1. In other words, the read voltage management circuit unit 215 chooses the first read voltage set (i.e., the first read voltage set V(1)) in the X read voltage sets to read the target memory cells of the target word line.

Then, the read voltage management circuit unit 215 (e.g., the Gray code counter circuit 2151) respectively reads the target memory cells by using the N−1 read voltages of the $i^{th}$ read voltage set to obtain the read bit values.

Then, the read voltage management circuit unit 215 (or the Gray code counter circuit 2151) may classify the read voltage values into N read bit value sets based on the N Gray codes, where the $k^{th}$ read bit value set of the N read bit value sets belongs to the $k^{th}$ Gray code of the N Gray codes.

More specifically, the read voltage management circuit unit 215 uses the seven read voltages $V(1)_1$ to $V(1)^7$ to read the target memory cells of the target word line, so as to identify the Gray codes corresponding to the respective target memory cells based on the obtained read bit values and further classify the obtained read bit values into the corresponding read bit value sets based on the different Gray codes. For example, an obtained read bit value "111" may be classified into a read bit value set corresponding to the Gray code "111".

Then, the read voltage management circuit unit 215 (or the Gray code counter circuit 2151) may sum up the number of the read bit value of the $k^{th}$ read bit value set as a Gray code count of the $i^{th}$ read voltage set corresponding to the $k^{th}$ Gray code, so as to obtained N Gray code counts of the $i^{th}$ read voltage set (the N Gray code counts of the $i^{th}$ read voltage set may also be considered as a Gray code count set C(i) of the $i^{th}$ read voltage set). In addition, the N Gray code counts are ordered according to a third predetermined order, and k may be 1 to N based on the third predetermined order. For example, after the read bit values of the target memory cells are classified into the read bit value sets corresponding to a plurality of different Gray codes G1 to G8, the read voltage management circuit unit 215 (or the Gray code counter circuit 2151) may further sum up the numbers of the read bit values in the respective read bit value sets. For example, the number of the read bit values of the read bit value set corresponding to the Gray code G1 "111" may be calculated as a Gray code count $C(1)_1$. Based on the principle, Gray code counts $C(1)_1$ to $C(1)_8$ of the read bit value sets respectively corresponding to the Gray codes G1 to G8 may be calculated. Here, "(1)" in $C(1)_1$ indicates an order value of the read voltage set corresponding to the Gray code count in the X read voltage sets based on the first predetermined order, and the subscript digit "1" in $C(1)_1$ indicates an order value of the Gray code count in the Gray code count set to which the Gray code count belongs based on the third predetermined order as well as the Gray code of the N Gray codes to which the Gray code count corresponds.

It should be noted that the read voltage management circuit unit 215 (or the Gray code counter circuit 2151) may adopt the first read voltage set and a corresponding threshold voltage distribution diagram to calculate the Gray code counts $C(1)_1$ to $C(1)_8$ which correspond to the first read voltage set and respectively correspond to the Gray codes G1 to G8. For example, the Gray code count $C(1)_1$ corresponding to the Gray code G1 may be considered as the number of memory cells in the threshold voltage distribution on the left of the read voltage $V(1)_1$ (e.g., the grey area corresponding to the Gray code G1 shown in FIG. 3), the Gray code count $C(1)_5$ corresponding to the Gray code G5 may be considered as the number of memory cells in the threshold voltage distribution between the read voltage $V(1)_4$ and the read voltage $V(1)_5$ (e.g., the grey area corresponding to the Gray code G5 shown in FIG. 3), and the Gray code count $C(1)_8$ corresponding to the Gray code G8 may be considered as the number of memory cells in the threshold voltage distribution on the right of the read voltage $V(1)_7$ (e.g., the grey area corresponding to the Gray code G8 shown in FIG. 3).

Figure 5:
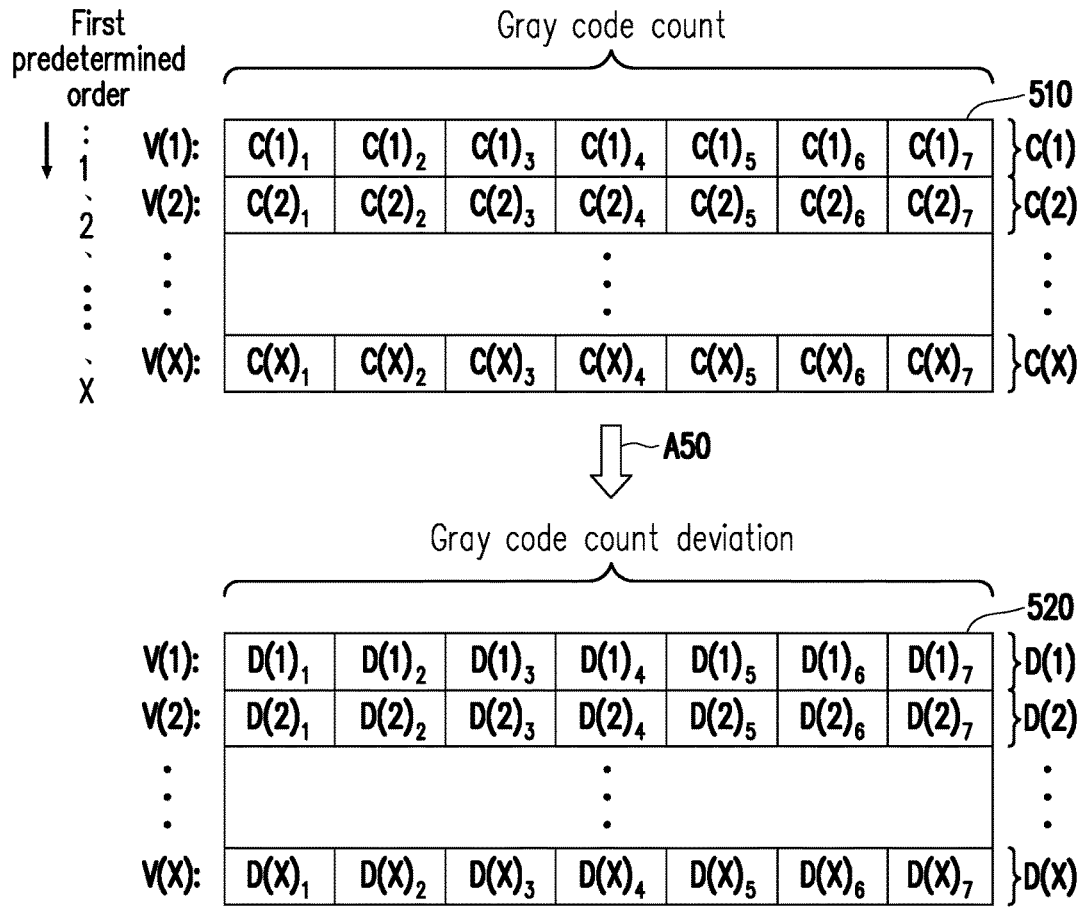
FIG. 5 is a schematic diagram illustrating calculating Gray code count deviations according to an embodiment of the invention.

FIG. 5 is a schematic diagram illustrating calculating Gray code count deviations according to an embodiment of the invention. Referring to FIG. 5, Gray code count sets $C(1)$ to $C(X)$ respectively corresponding to the read voltage sets $V(1)$ to $V(X)$ may be recorded in the form as shown in a table 510, for example.

After obtaining the Gray code count sets $C(1)$ to $C(X)$ respectively corresponding to the read voltage sets $V(1)$ to $V(X)$, the read voltage management circuit unit 215 (or the Gray code counter circuit 2151) may respectively subtract a Gray code count standard from the N Gray code counts of the $i^{th}$ read voltage set, as indicated by an arrow sign A50, to obtain N differences. In addition, the N differences may be adopted as N Gray code count deviations corresponding to the $i^{th}$ read voltage set. Also, the N Gray code count deviations corresponding to the $i^{th}$ read voltage set may also be considered as a Gray code count deviation set $D(i)$ corresponding to the $i^{th}$ read voltage set. Accordingly, Gray code count deviation sets $D(1)$ to $D(X)$ respectively corresponding to the read voltage sets $V(1)$ to $V(X)$ may be obtained respectively.

In the embodiment, the Gray code count standard may be set based on the total number of the target memory cells that are read (also referred to as an amount of read memory cells). As an example, the total number of the read target memory cells is 18592*8. In this example, the read target memory cells include a plurality of memory cells storing 16 kilobytes of user data and a plurality of memory cells storing 2208 bytes of system data. The number "18592" in "18592*8" may also be construed as the Gray code count standard (represented as $C_{std}$, for example) or a Gray code count average value (represented as $C_{avg}$, for example). In other words, the Gray code count standard is a value of the amount of read memory cells divided by N, where the value of N may be set in advance based on the physical specification of a memory (e.g., MLC: N=4; TLC: N=8; QLC: N=16).

It should be noted that, in an embodiment, the read voltage management circuit unit 215 (or the Gray code counter circuit 2151) may calculate a Gray code count deviation $D(i)_k$ based on a formula (F) as follows:

$$D(i)_k = |C(i)_k - C_{std}| \quad (F)$$

In the formula (F), i is 1 to X based on the first predetermined order, and k is 1 to N based on the third predetermined order. In other words, the Gray code count deviation is an absolute value of a difference between the corresponding Gray code count and the Gray code count standard.

After the N Gray code count deviations corresponding to the $i^{th}$ read voltage set are obtained, the Gray code count deviation sets $D(1)$ to $D(X)$ respectively corresponding to the read voltage sets $V(1)$ to $V(X)$ may be recorded in the form of a table 520, for example. Besides, the read voltage management circuit unit 215 (or the Gray code counter circuit 2151) may calculate a summation of the N Gray code count deviations corresponding to the $i^{th}$ read voltage set, and adopt the summation as the $i^{th}$ Gray code count deviation summation of the X Gray code count deviation summations. In addition, the $i^{th}$ Gray code count deviation summation corresponds to the $i^{th}$ read voltage set. For example, the read voltage management circuit unit 215 (or the Gray code counter circuit 2151) may sum up all the Gray code count deviations $D(1)_1$ to $D(1)_7$ in the Gray code count deviation set $D(1)$ and adopt the summation obtained accordingly as a Gray code count deviation summation SD(1). The Gray code count deviation summation SD(1) corresponds to the read voltage set $V(1)$.

Referring to FIG. 2 again, at Step S25, the read voltage management circuit unit 215 (or the read voltage optimization circuit 2152) may choose one of the X read voltage sets as an optimized read voltage set based on the X Gray code count deviation summations.

Specifically, in an embodiment, the read voltage management circuit unit 215 (or the read voltage optimization circuit 2152) may identify a plurality of target Gray code count deviation summations lower than a deviation summation threshold from the X Gray code count deviation summations. Then, the read voltage management circuit unit 215 (or the read voltage optimization circuit 2152) may adopt the read voltage set corresponding to a target Gray code count deviation summation ordered in the middle among the target Gray code count deviation summations based on the first predetermined order as the optimized read voltage set.

FIG. 6A is a schematic diagram illustrating determining an optimized read voltage set based on Gray code count deviation summations according to an embodiment of the invention. Referring to FIG. 6A, for the ease of description, it is assumed as an example that there are a total of 13 read voltage sets $V(1)$ to $V(13)$ in the embodiment. In addition, Gray code count deviation summations SD(1) to SD(13) respectively corresponding to the read voltage sets $V(1)$ to $V(13)$ obtained accordingly are recorded in a table 610. In addition, the deviation summation threshold is 1500. The read voltage management circuit unit 215 (or the read voltage optimization circuit 2152) may identify the target Gray code count summations SD(7), SD(8), and SD(9) lower than the threshold summation threshold from the Gray code count deviation summations SD(1) to SD(13). In addition, the target Gray code count deviation summation SD(8) is the target Gray code count deviation summation ordered in the middle among the target Gray code count summations SD(7), SD(8), and SD(9) based on the first predetermined order. Accordingly, the read voltage management circuit unit 215 (or the read voltage optimization circuit 2152) may adopt the read voltage set $V(8)$ corresponding to the target Gray code count deviation summation SD(8) as the optimized read voltage set.

It should be noted that, if there are two target Gray code count deviation summations ordered in the middle (e.g., the target Gray code count deviation summations SD(7) and SD(8) in FIG. 6B), the read voltage management circuit unit 215 (or the read voltage optimization circuit 2152) may choose the minimum (e.g., the target Gray code count deviation summation SD(7)) one of the two target Gray code count deviation summations or arbitrarily choose one of the two target Gray code count deviation summations.

Alternatively, in another embodiment, the read voltage management circuit unit 215 (or the read voltage optimization circuit 2152) may identify the target Gray code count deviation summations lower than the deviation summation threshold from the X Gray code count deviation summations. Then, the read voltage management circuit unit 215 (or the read voltage optimization circuit 2152) may adopt the read voltage set corresponding to the minimum one of the target Gray code count deviation summations as the optimized read voltage set.

FIG. 6B is a schematic diagram illustrating determining an optimized read voltage set based on Gray code count deviation summations according to another embodiment of the invention. For example, referring to FIG. 1, it is assumed that there are a total of read voltage sets V(1) to V(13) in the embodiment for the ease of description. In addition, Gray code count deviation summations SD(1) to SD(13) respectively corresponding to the read voltage sets V(1) to V(13) obtained accordingly are recorded in a table 620. In addition, the deviation summation threshold is 1500. The read voltage management circuit unit 215 (or the read voltage optimization circuit 2152) may identify the target Gray code count summations SD(6), SD(7), SD(8), and SD(9) lower than the deviation summation threshold from the Gray code count deviation summations SD(1) to SD(13). In addition, the target Gray code count deviation summation SD(7) is the minimum one of the target Gray code count summations SD(6), SD(7), SD(8), and SD(9). Accordingly, the read voltage management circuit unit 215 (or the read voltage optimization circuit 2152) may adopt the read voltage set V(7) corresponding to the target Gray code count deviation summation SD(7) as the optimized read voltage set.

It should be noted that, if there are a plurality of minimum target Gray code count deviation summations, the read voltage management circuit unit 215 (or the read voltage optimization circuit 2152) may choose the middle one of the minimum target Gray code count deviation summations or arbitrarily choose one of the minimum target Gray code count deviation summations.

In addition, the manufacturer may adjust the value of the deviation summation threshold. For example, in an embodiment, the manufacturer may adjust the value of the deviation summation threshold based on a physical condition of the target memory cells. Specifically, the value of the deviation summation threshold may be set differently based on the type of the rewritable non-volatile memory module 220 and the decoding ability of the error checking and correcting circuit. For example, if the error checking and correcting circuit has a stronger decoding ability, a greater value may be chosen as the deviation summation threshold.

After the optimized read voltage set is chosen, the overall read voltage optimization operation corresponding to the target memory cells is completed. The read voltage management circuit unit 215 (or the read voltage optimization circuit 2152) may record the optimized read voltage set to directly apply the recorded optimized read voltage set during reading of another word line having a similar physical condition. In another example, the recorded optimized read voltage set may be directly applied for other word lines of the same group.

It should be noted that, the concept of the embodiments of the invention is that a smaller difference (i.e., the Gray code count deviation) between each of the Gray code counts of the Gray code count set corresponding to a read voltage set and the Gray code count standard indicates that the read bit values obtained by using the read voltage set better resembles the written data previously programmed to the target cells, namely a better quality of the data read by using the read voltage set. This is because the written data may be firstly subjected to a unification operation (e.g., a scramble operation), so the memory cells of the word line to which the data is written may uniformly store all kinds of Gray codes, and the Gray code counts of all the memory cells may be close to the Gray code count standard. Namely, in an ideal situation, the Gray code count deviation summation of the data read by using the optimal read voltage set should be close to the Gray code count standard. Hence, a read voltage set having a smaller Gray code count deviation summation is a better read voltage set, and the optimal read voltage set may be found by exploiting such trait.

To put it differently, the fundamental idea of the embodiment is that, by using the optimized read voltage set to read the target memory cells, the Gray code counts of the read bit value sets belonging to different Gray codes should be close to the Gray code count standard. Therefore, the optimized read voltage set found accordingly may have a smaller the Gray code count deviation summation than the Gray code count deviation summations of other less qualified read voltage sets. Hence, the number of error bits of the data obtained through reading the target memory cells by using the optimized read voltage set is lower, or, the data read by using the read voltage set having a higher Gray code count deviation summation may contain a greater number of error bits.

People having ordinary skills in the art may follow the idea set forth above and modify the decoding method (read voltage optimization method/operation) of the embodiments without departing from the spirit and the scope of the invention. Compared with the conventional processes, the decoding method according to the embodiment only requires to read the target word line X*M times by using X read voltage sets (M is the number of bit values each memory cell is able to store). In other words, the optimized read voltage set of the target word line may be obtained after X*M read counts (the number of read counts required in the foregoing provided embodiment is M*X). However, the number of read counts required in the first conventional process is $(2^M-1)*X$ read counts. Taking a TLC flash memory (where one memory cell stores three bit values) as an example, a read voltage set has a total of seven read voltages corresponding to different voltage intervals. If the first conventional process is adopted, the process requires to fix six read voltages and adjust one read voltage for reading. If each read voltage requires X times of adjustment, and the results are obtained through reading to compare all the results and find out the optimal one, it requires $(2^3-1)*X=7*X$ read counts to obtain the optimal read voltage (but, the decoding method of the foregoing provided embodiment only requires 3*X read counts). Besides, verified data are required for such conventional process. In other words, the first conventional process requires a large amount of computing resources (e.g., adjusting the read voltage and verifying corresponding read data) and storage space (e.g., the space for storing the verified data).

Regarding the difference in read counts, the decoding method provided in the embodiment significantly reduces the time and computation resources consumed for the read voltage optimization process and is still able to render the effectiveness and accuracy of the first conventional process. Therefore, decoding (by the error checking and correcting circuit) becomes more efficient.

Besides, compared with the second conventional process, the decoding method provided in the embodiment is able to utilize a greater number of the X read voltage sets. Therefore, the optimized read voltage obtained accordingly is more accurate than the read voltage obtained based on the second conventional process. The adjustment read voltage sets according to the second conventional process are fewer than the X read voltage sets provided in the present embodiment.

Compared with the higher chance of failure and the greater number of error bits in the data read based on the second conventional process, the decoding method provided in the embodiments of the invention is able to lower the chance of failure and reduce the greater number of error bits, as the method provided in the embodiments of the invention is able to achieve the accuracy of the first conventional process. Thus, the load for decoding (error checking and correcting circuit) is reduced. Meanwhile, based on the read voltage optimization process according to the embodiments of the invention, the optimized read voltage set can be quickly and efficiently found. In other words, the decoding method and the storage controller according to the embodiments of the invention keep the advantages of the conventional processes, while alleviate the defects of the conventional processes.

Based on the above, the decoding method and the storage controller according to the embodiments of the invention are capable of performing the read voltage optimization process corresponding to the target word line to any target word line without preparing verified data. In the read voltage optimization operation, the storage controller may directly use multiple different read voltage sets to obtain multiple different Gray code count deviation summations. Accordingly, one of the X read voltage set may be chosen as the optimized read voltage set based on the X Gray code count deviation summations, so as to form the optimized read voltage set corresponding to the target word line. By using the optimized read voltage set, the accuracy of the read data is facilitated, and the decoding for reading becomes more efficient in general.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A decoding method for a storage device comprising a rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, N is a first predetermined positive integer greater than 2, and the method comprises:

choosing a target word line of the word lines, wherein a plurality of target memory cells of the target word line are programmed;

reading the target memory cells by respectively using a plurality of different X read voltage sets to obtain X Gray code count deviation summations, wherein X is a second predetermined positive integer, the X read voltage sets and the corresponding X Gray code count deviation summations are ordered based on a first predetermined order, each of the X read voltage sets has N−1 read voltages ordered based on a second predetermined order, and an $i^{th}$ Gray code count deviation summation in the X Gray code count deviation summations corresponds to an $i^{th}$ read voltage set of the X read voltage sets, wherein i is 1 to X based on the first predetermined order; and choosing one of the X read voltage sets as an optimized read voltage set based on the X Gray code count deviation summations.

2. The decoding method as claimed in claim 1, wherein a voltage difference between a $j^{th}$ read voltage of $i^{th}$ read voltage set and a $j^{th}$ read voltage of an $i+1^{th}$ read voltage set in the X read voltage sets is fixed as a first predetermined voltage difference, and j is 1 to N−1 based on the second predetermined order.

3. The decoding method as claimed in claim 1, wherein a voltage difference between a $j^{th}$ read voltage of the $i^{th}$ read voltage set and a $j^{th}$ read voltage of an $i+1^{th}$ read voltage set in the X read voltage sets is not fixed, and j is 1 to N−1 based on the second predetermined order.

4. The decoding method as claimed in claim 1, wherein values of j comprise 1 to N−1 based on the second predetermined order, and the step of reading the target memory cells by respectively using the different X read voltage sets to obtain the X Gray code count deviation summations comprises:

choosing the $i^{th}$ read voltage set of the X read voltage sets, wherein values of i comprise 1 to X based on the first predetermined order;

reading the target memory cells by using N−1 read voltages of the $i^{th}$ read voltage set, so as to obtain a plurality of read bit values;

classifying the read bit values into N read bit value sets based on the N Gray codes, wherein a $k^{th}$ read bit value set of the N read bit value sets belongs to a $k^{th}$ Gray code of the N Gray codes;

summing up the number of the read bit values of the $k^{th}$ read bit value set as a Gray code count of the $i^{th}$ read voltage set corresponding to the $k^{th}$ Gray code, so as to obtain N Gray code counts of the $i^{th}$ read voltage set, wherein the N Gray code counts are ordered based on a third predetermined order, and k is 1 to N based on the third predetermined order;

subtracting a Gray code count standard from the respective N Gray code counts of the $i^{th}$ read voltage set to obtain N differences, and adopting absolute values of the N differences as N Gray code count deviations corresponding to the $i^{th}$ read voltage set; and calculating a summation of the N Gray code count deviations corresponding to the $i^{th}$ read voltage set, and adopting the summation as an $i^{th}$ Gray code count deviation summation in the X Gray code count deviation summations, wherein the $i^{th}$ Gray code count deviation summation corresponds to the $i^{th}$ read voltage set.

5. The decoding method as claimed in claim 1, wherein the choosing the target word line of the word lines comprises:

choosing the target word line at a specific time point, wherein the specific time point meets one of the following:

when the storage device is idling for over a predetermined threshold of time;

when the storage device is turned on; and when the number of error bits of data read from a word line exceeds an error bit threshold, the word line is set to be the target word line.

6. The decoding method as claimed in claim 1, further comprising:

identifying a plurality of statistical values of the target word line in response to choosing the target word line; and adjusting a size of the predetermined voltage difference and a value of the second predetermined positive integer based on at least one of the statistical values, wherein the statistical values comprise:
   a value of program erase cycles of the target word line;
   a read counter value of the target word line;
   a retention time value of the target word line; and
   the number of error bits of data stored in the target word line.

7. The decoding method as claimed in claim 1, wherein choosing the one of the X read voltage sets as the optimized read voltage set based on the X Gray code count deviation summations comprises:
   identifying a plurality of target Gray code count deviation summations lower than a deviation summation threshold from the X Gray code count deviation summations; and
   adopting a read voltage set corresponding to a target Gray code count deviation summation ordered in the middle among the target Gray code count deviation summations based on the first predetermined order as the optimized read voltage set.

8. The decoding method as claimed in claim 1, wherein choosing the one of the X read voltage sets as the optimized read voltage set based on the X Gray code count deviation summations comprises:
   identifying a plurality of target Gray code count deviation summations lower than a deviation summation threshold from the X Gray code count deviation summations; and
   adopting a read voltage set corresponding to a minimum target Gray code count deviation summation of the target Gray code count deviation summations as the optimized read voltage set.

9. A storage controller, controlling a storage device comprising a rewritable non-volatile memory module, the storage controller comprising:
   a connection interface circuit, coupled to a host system;
   a memory interface control circuit, coupled to the rewritable non-volatile memory module, wherein the rewritable non-volatile memory module comprises a plurality of word lines, each of the word lines comprises a plurality of memory cells, each of the memory cells is programmed to store a bit value corresponding to one of a plurality of different Gray codes, a total number of the Gray codes is N, and N is a first predetermined positive integer greater than 2;
   a read voltage management circuit unit; and
   a processor, coupled to the connection interface circuit, the memory interface control circuit, and the read voltage management circuit unit,
   wherein the processor chooses a target word line of the word lines, instructs the read voltage management circuit unit to perform a read voltage optimization operation corresponding to the target word line, a plurality of target memory cells of the target word line are programmed, and wherein in the read voltage optimization operation:
   the read voltage management circuit unit reads the target memory cells by respectively using a plurality of different X read voltage sets to obtain X Gray code count deviation summations, wherein X is a second predetermined positive integer, the X read voltage sets and the corresponding X Gray code count deviation summations are ordered based on a first predetermined order, each of the X read voltage sets has N−1 read voltages ordered based on a second predetermined order, and an $i^{th}$ Gray code count deviation summation in the X Gray code count deviation summations corresponds to an $i^{th}$ read voltage set of the X read voltage sets, wherein i is 1 to X based on the first predetermined order,
   wherein the read voltage management circuit unit further chooses one of the X read voltage sets as an optimized read voltage set based on the X Gray code count deviation summations.

10. The storage controller as claimed in claim 9, wherein a voltage difference between a $j^{th}$ read voltage of the $i^{th}$ read voltage set and a $j^{th}$ read voltage of an $i+1^{th}$ read voltage set in the X read voltage sets is fixed as a first predetermined voltage difference, and j is 1 to N−1 based on the second predetermined order.

11. The storage controller as claimed in claim 9, wherein a voltage difference between a $j^{th}$ read voltage of the $i^{th}$ read voltage set and a $j^{th}$ read voltage of an $i+1^{th}$ read voltage set in the X read voltage sets is not fixed, and j is 1 to N−1 based on the second predetermined order.

12. The storage controller as claimed in claim 9, wherein values of j comprise 1 to N−1 based on the second predetermined order, and in the operation of reading the target memory cells by respectively using the different X read voltage sets to obtain the X Gray code count deviation summations,
   the read voltage management circuit unit chooses the $i^{th}$ read voltage set of the X read voltage sets, wherein values of i comprise 1 to X based on the first predetermined order,
   the read voltage management circuit unit reads the target memory cells by using N−1 read voltages of the $i^{th}$ read voltage set, so as to obtain a plurality of read bit values,
   the read voltage management circuit unit classifies the read bit values into N read bit value sets based on the N Gray codes, wherein a $k^{th}$ read bit value set of the N read bit value sets belongs to a $k^{th}$ Gray code of the N Gray codes,
   the read voltage management circuit unit sums up the number of the read bit values of the $k^{th}$ read bit value set as a Gray code count of the $i^{th}$ read voltage set corresponding to the $k^{th}$ Gray code, so as to obtain N Gray code counts of the $i^{th}$ read voltage set, wherein the N Gray code counts are ordered based on a third predetermined order, and k is 1 to N based on the third predetermined order,
   the read voltage management circuit subtracts a Gray code count standard from the respective N Gray code counts of the $i^{th}$ read voltage set to obtain N differences, and adopts absolute values of the N differences as N Gray code count deviations corresponding to the $i^{th}$ read voltage set, and
   the read voltage management circuit unit calculates a summation of the N Gray code count deviations corresponding to the $i^{th}$ read voltage set, and adopts the summation as an $i^{th}$ Gray code count deviation summation in the X Gray code count deviation summations, wherein the $i^{th}$ Gray code count deviation summation corresponds to the $i^{th}$ read voltage set.

13. The storage controller as claimed in claim 9, wherein in the operation of choosing the target word line of the word lines,
   the processor chooses the target word line at a specific time point, wherein the specific time point meets one of the following:
      when the storage device is idling for over a predetermined threshold of time;

when the storage device is turned on; and when the number of error bits of data read from a word line exceeds an error bit threshold, wherein the word line is set to be the target word line.

14. The storage controller as claimed in claim 9, wherein:

the processor identifies a plurality of statistical values of the target word line in response to choosing the target word line, and the processor adjusts a size of the predetermined voltage difference and a value of the second predetermined positive integer based on at least one of the statistical values, wherein the statistical values comprise:

a value of program erase cycles of the target word line;
a read counter value of the target word line;
a retention time value of the target word line; and
the number of error bits of data stored in the target word line.

15. The storage controller as claimed in claim 9, wherein in the operation of choosing the one of the X read voltage sets as the optimized read voltage set based on the X Gray code count deviation summations, the read voltage management circuit unit identifies a plurality of target Gray code count deviation summations lower than a deviation summation threshold from the X Gray code count deviation summations; and the read voltage management circuit unit adopts a read voltage set corresponding to a target Gray code count deviation summation ordered in the middle among the target Gray code count deviation summations based on the first predetermined order as the optimized read voltage set.

16. The storage controller as claimed in claim 9, wherein in the operation of choosing the one of the X read voltage sets as the optimized read voltage set based on the X Gray code count deviation summations, the read voltage management circuit unit identifies a plurality of target Gray code count deviation summations lower than a deviation summation threshold from the X Gray code count deviation summations; and the read voltage management circuit unit adopts a read voltage set corresponding to a minimum target Gray code count deviation summation of the target Gray code count deviation summations as the optimized read voltage set.

* * * * *